United States Patent
Onishi et al.

[11] Patent Number: 6,162,381
[45] Date of Patent: Dec. 19, 2000

[54] METHOD FOR PRODUCING A MOLDED UNIT WITH ELECTRODES EMBEDDED THEREIN

[75] Inventors: Takashi Onishi; Toshiaki Hata, both of Himeji, Japan

[73] Assignee: Mitsubishi Denki Kabushiki Kaisha, Tokyo, Japan

[21] Appl. No.: 08/205,821

[22] Filed: Mar. 2, 1994

Related U.S. Application Data

[63] Continuation of application No. 07/699,110, May 13, 1991, abandoned.

[30] Foreign Application Priority Data

May 15, 1990 [JP] Japan ................................. 2-122996

[51] Int. Cl.[7] ........................... B29C 70/70; B29C 70/84; B29C 70/88
[52] U.S. Cl. ............... 264/157; 264/272.14; 264/272.15; 264/277; 264/254
[58] Field of Search .................. 264/272.11, 272.14, 264/272.15, 276, 275, 277, 278, 138, 157, 254; 29/418, 423, 883

[56] References Cited

U.S. PATENT DOCUMENTS

| | | | |
|---|---|---|---|
| 3,216,089 | 11/1965 | Dettman | 264/272.14 |
| 4,158,254 | 6/1979 | Uda | 29/418 |
| 4,451,973 | 6/1984 | Tateno et al. | 264/272.17 |
| 4,470,786 | 9/1984 | Sano et al. | 264/272.14 |
| 4,859,632 | 8/1989 | Lumbard | 264/272.11 |
| 4,895,536 | 1/1990 | Gingerich et al. | 264/272.14 |
| 4,965,933 | 10/1990 | Mraz et al. | 29/418 |
| 5,016,337 | 5/1991 | Ejima | 29/423 |
| 5,049,055 | 9/1991 | Yokoyama | 264/272.17 |

FOREIGN PATENT DOCUMENTS

| | | |
|---|---|---|
| 1590728 | 5/1970 | Germany . |
| 3540639 | 5/1986 | Germany . |
| 3515911 | 11/1986 | Germany . |

OTHER PUBLICATIONS

F. Strasser, Santiago, de Chile; Stanzteile Zum Einbetten in Kunststoffteile, Anwendung und Design, Feb. 1988.

*Primary Examiner*—Angela Ortiz
*Attorney, Agent, or Firm*—Sughrue, Mion, Zinn, Macpeak & Seas, PLLC

[57] ABSTRACT

A plurality of mutually separate electrodes supported by a support frame are pre-molded into an integral electrode assembly in which the electrodes are connected with each other through resin moldings. The electrode assembly thus formed is cut off from the support frame to provide a primary product in which the electrodes are electrically disconnected from each other. The primary product is then molded into a molded unit having the electrodes embedded therein. Preferably, the primary product is placed in a mold and supported at a predetermined location by a plurality of support pins which abut against the resin moldings. The support pins are removed from the molded unit while leaving corresponding through-holes after a molten resin is poured into the mold and cooled. The electrodes embedded in the molded unit are prevented from being exposed to the outside of the molded unit via through-holes.

3 Claims, 3 Drawing Sheets

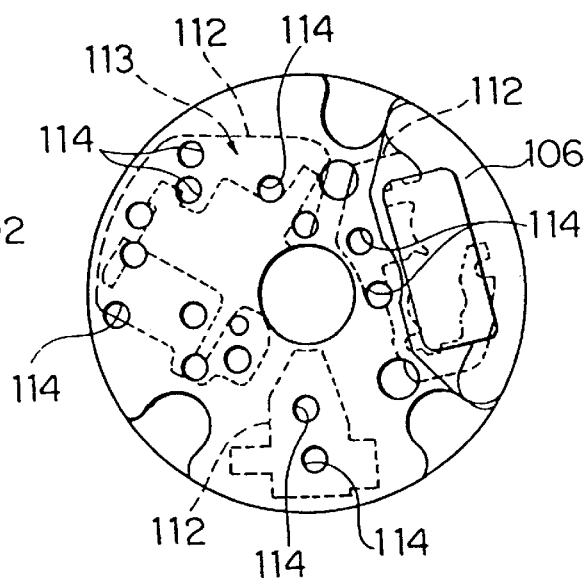
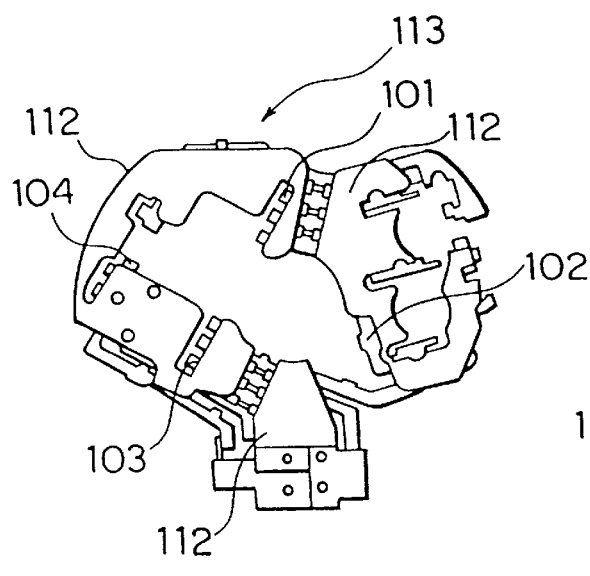
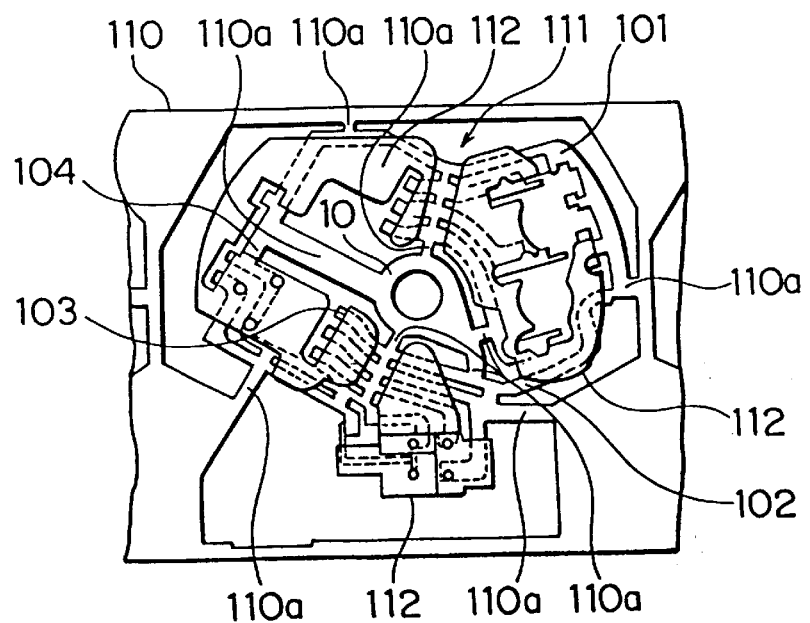

METHOD FOR PRODUCING A MOLDED UNIT WITH ELECTRODES EMBEDDED THEREIN

This is a Continuation of application Ser. No. 07/699,110 filed May 13, 1991, now abandoned.

BACKGROUND OF THE INVENTION

The present invention relates to a method for producing a molded unit having a plurality of electrodes embedded therein.

An example of a known molded unit with electrodes embedded therein, which forms a rotational angle sensor for sensing the crank angle or position of an internal combustion engine, is shown in FIGS. 4 through 6 which are a plan view, a bottom view and a cross section along line VI—VI of FIG. 5, respectively. The molded unit includes a plurality of first through fifth electrodes 1, 2, 3, 4 and 5, as illustrated in FIG. 7, which are embedded in a circular-shaped molded body 6 formed of a resin. The molded body 6 has a plurality of through-holes 7 formed therethrough at the backside thereof which is opposite to that surface of the molded body 6 at which a plurality of recesses are formed for mounting electric elements 8.

The above-described molded unit is produced as follows. First, a plurality of electrodes 1–5, which are electrically and mechanically disconnected from each other, are respectively or individually placed in a mold at predetermined locations therein and exactly positioned or supported in place by a plurality of support pins. Then, a molten resin is poured into the mold and cooled to provide a molded body 6 having the electrodes 1–5 embedded therein. After cooling of the molten resin, the support pins are removed from the molded body 6, forming a plurality of through-holes 7 at the backside thereof, as shown in FIGS. 5 and 6. In this state, it is undesirable for one side of the surfaces of the electrodes 1 through 5 to be exposed to the outside of the molded body 6 through the through-holes 7. Therefore, the through-holes 7 thus formed are then closed by filling therein a sealing material such as a silicone-based adhesive. Such a filling operation is troublesome, adding to the cost of manufacture. In addition, it is rather difficult, cumbersome and inefficient to exactly and individually position the mutually separated electrodes 1–5 at their respective predetermined locations inside the mold.

SUMMARY OF THE INVENTION

Accordingly, the present invention is intended to overcome the above-mentioned problems encountered with the known method for producing a molded unit with electrodes therein.

An object of the invention is provide a novel and improved method for producing a molded unit with a plurality of electrodes embedded therein which can prevent the embedded electrodes from being exposed to the outside of a molded body, and which is simple, efficient and has low manufacturing costs.

In order to achieve the above object, according to the invention, there is provided a method for producing a molded unit with a plurality of electrodes comprising the steps of:

pre-molding a plurality of electrodes supported by a support frame into an electrode assembly in which the electrodes are connected with each other through resin moldings;

cutting off the electrode assembly from the support frame to provide a primary product in which the electrodes are electrically disconnected from each other; and molding the primary product into a molded unit having the electrodes embedded therein.

Preferably, the step of molding the primary product into a molded unit comprises:

placing the primary product in a mold at a predetermined location; and pouring a molten resin into the mold to provide the molded unit.

Preferably, the primary product is supported in the mold at the predetermined location by a plurality of support pins which abut against the resin moldings. The support pins are removed from the molded unit after the molten resin poured into the mold is cooled.

The above and other objects, features and advantages of the present invention will become more readily apparent from the following detailed description of a preferred embodiment of the invention taken in conjunction with the accompanying drawings.

BRIEF DESCRIPTION OF THE DRAWINGS

FIG. 1 is a bottom view of a molded unit with electrodes produced in accordance with the method of invention;

FIG. 2 is a plan view of a primary molded product to be incorporated in the molded unit of FIG. 1;

FIG. 3 is a plan view of the electrodes of FIG. 1, but showing their state before being formed into the primary molded product of FIG. 2;

DESCRIPTION OF THE PREFERRED EMBODIMENT

Figure 4:
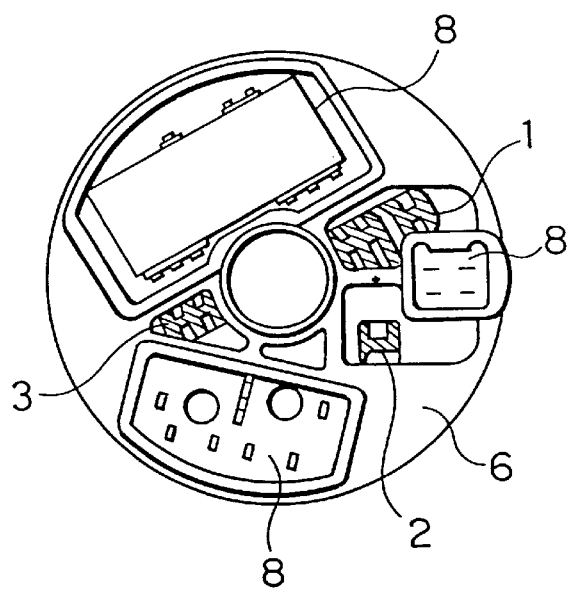
FIG. 4 is a plan view of a molded unit with electrodes produced in accordance with a known method.
Figure 5:
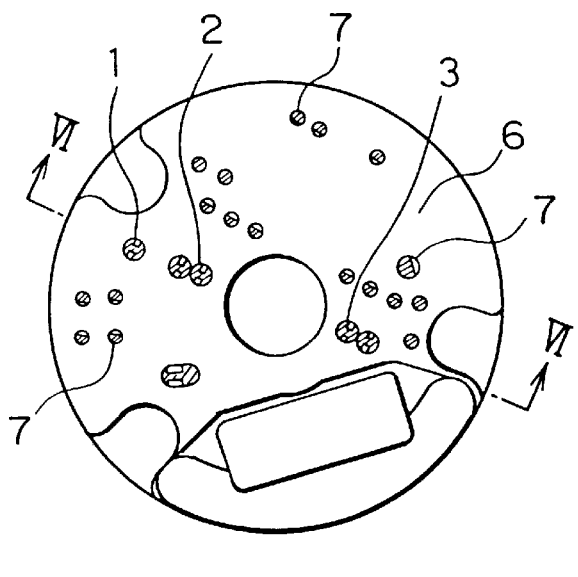
FIG. 5 is a bottom view of the molded unit of FIG. 4.
Figure 6:
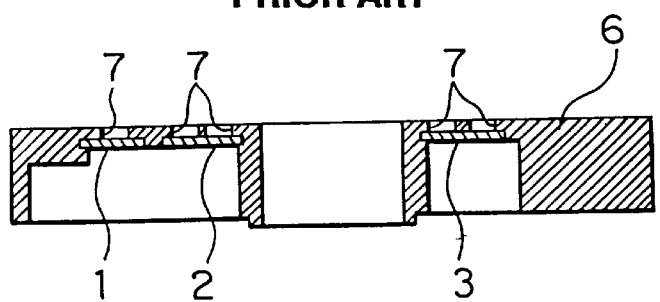
FIG. 6 is a cross section taken along line VI—VI in FIG. 5.
Figure 7:
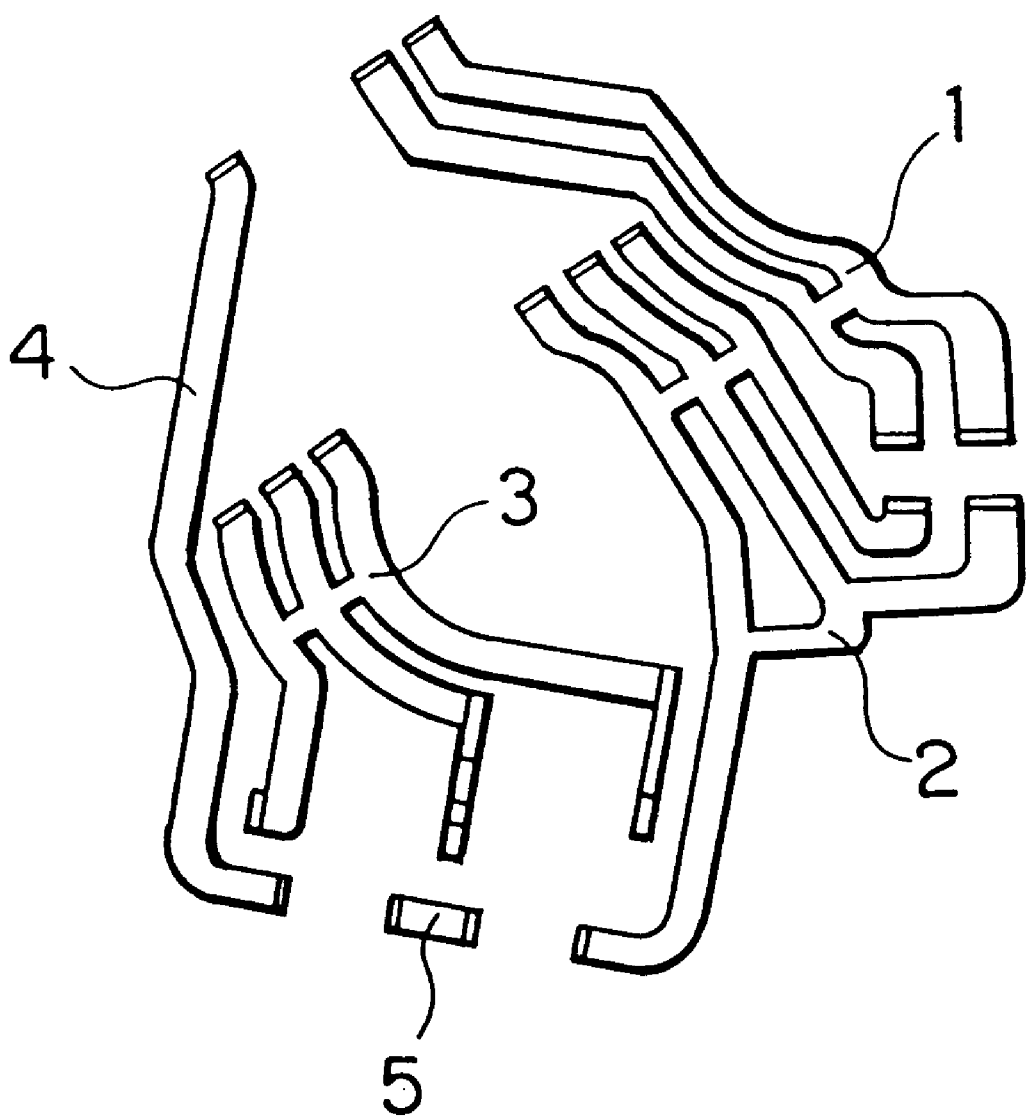
FIG. 7 is a plan view of the electrodes to be embedded in the molded unit of FIG. 4.

A preferred embodiment of the present invention will now be described in detail while referring to FIGS. 1 through 3 of the drawings.

FIG. 1 shows, in a bottom view, a molded unit with electrodes produced in accordance with the method of the invention. The molded unit of FIG. 1 is produced as follows. First, as shown in FIG. 3, a plurality of electrodes 101–104, which are supported by a support frame 110 of a metallic thin film through a plurality of support members 110a, are integrally pre-molded by an electrically insulating resin into an electrode assembly 111, in which the electrodes 101–104 are integrally and mechanically connected with each other through resin moldings 112. Then, the electrode assembly 111 thus formed is cut off from the support frame 110 at the support members 110a into a primary or intermediate molded product 113, as shown in FIG. 2. The primary molded product 113 thus formed is finally molded into a molded unit with the electrodes embedded therein, as shown in FIG. 1. Specifically, the primary molded product 113, which has the electrodes 101–104 mechanically connected with each other through the electrically insulating resin moldings 112, is placed into a mold at a predetermined location therein and supported by a plurality of support pins (not shown) at appropriate locations of the resin moldings 112. In this state, the support pins abut against the resin moldings 112 to support the primary molded product 113. A molten resin of an electrically insulating property is then poured into the mold and cooled to provide a molded body 106 of a generally cylindrical shape. After cooling of the resin, the support pins are removed from the molded body 106, leaving through-holes 114 at the backside of the cylindrical molded body 106. In this case, however, the support pins abut against the resin moldings 112 but not the electrodes 101–104 at all, so there is no possibility of the electrodes 101–104 being exposed to the outside of the molded body 106 via the through-holes 114. As a result, there is no need to take an additional measure such as closing the through-holes 114 with a sealing material as would by required with the aforementioned known method, thus resulting in a substantial improvement in productivity.

In addition, the primary molded product 113 comprising the electrode assembly 111, in which the electrodes 101–104 are mechanically and integrally connected with each other through the electrically insulating resin moldings 112, can be exactly positioned in the mold at a predetermined location with utmost ease. This serves to greatly simplify and facilitate the exact positioning of the electrodes in the mold as well as greatly increase the production efficiency. Thus, it becomes much easier to automate the entire process.

What is claimed is:

1. A method of producing a molded unit with a plurality of electrodes, comprising the ordered steps of:

a) pre-molding a plurality of electrodes (101–104) laterally connected to a surrounding support frame (110) and electrically connected to each other by respective support members (110*a*) to form an electrode assembly (111) in which the electrodes are integrally and mechanically connected with each other through resin moldings (112);

b) cutting through the support members to electrically disconnect the electrodes from each other and to separate the electrode assembly from the support frame, to thus provide a first, intermediate molded unit (113);

c) placing the intermediate molded unit in a mold;

d) supporting the intermediate molded unit at a predetermined location with a plurality of support pins which exclusively abut against the resin moldings and do not contact the electrodes;

e) pouring a molten resin into the mold to produce a second, final molded unit having the electrodes embedded therein; and f) removing the support pins from the final molded unit such that the electrodes are not exposed to the outside thereof through holes (114) left by the support pins.

2. A method according to claim 1, wherein the resin moldings mechanically connecting the electrodes with each other are formed of an electrically insulating resin.

3. A method according to claim 1, wherein the molten resin comprises an electrically insulating resin.

* * * * *